(12) United States Patent
Kim et al.

(10) Patent No.: US 8,098,008 B2
(45) Date of Patent: Jan. 17, 2012

(54) ORGANIC LIGHT EMITTING DIODE DISPLAY AND METHOD OF MANUFACTURING THE SAME

(75) Inventors: Eun-Ah Kim, Yongin (KR); Hee-Chul Jeon, Yongin (KR); Hee-Seong Jeong, Yongin (KR); Noh-Min Kwak, Yongin (KR); Soon-Ryong Park, Yongin (KR); Woo-Suk Jung, Yongin (KR); Joo-Hwa Lee, Yongin (KR); Chul-Woo Jeong, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 12/654,788

(22) Filed: Jan. 4, 2010

(65) Prior Publication Data

US 2010/0171419 A1    Jul. 8, 2010

(30) Foreign Application Priority Data

Jan. 7, 2009 (KR) .................. 10-2009-0001163

(51) Int. Cl.
*H01J 1/62* (2006.01)
(52) U.S. Cl. ........... 313/504; 313/506; 313/509; 445/24
(58) Field of Classification Search .......... 313/498–512; 445/24, 25
See application file for complete search history.

(56) References Cited

U.S. PATENT DOCUMENTS

| 2005/0263757 A1* | 12/2005 | Lee ................................. 257/40 |
| 2006/0290271 A1* | 12/2006 | Cok ............................. 313/504 |
| 2007/0080377 A1 | 4/2007 | Sung et al. |
| 2008/0246029 A1 | 10/2008 | Kang et al. |

FOREIGN PATENT DOCUMENTS

| JP | 2004-119197 A | 4/2004 |
| JP | 2004-192813 A | 7/2004 |
| JP | 2006-156396 A | 6/2006 |
| JP | 2007-286150 A | 1/2007 |
| KR | 10 2005-0030296 A | 3/2005 |
| KR | 10 2006-0059721 A | 6/2006 |
| KR | 10-0658758 B1 | 12/2006 |
| KR | 10-0833773 B1 | 5/2008 |

* cited by examiner

*Primary Examiner* — Bumsuk Won
(74) *Attorney, Agent, or Firm* — Lee & Morse, P.C.

(57) ABSTRACT

An OLED display includes a substrate member, a plurality of pixel electrodes on the substrate member, a pixel defining layer on the substrate member, the pixel defining layer including a pixel defining part and a plurality of light scattering spacer parts, the pixel defining part including a plurality of openings corresponding to and exposing the pixel electrodes, and the light scattering spacer parts protruding upward from the pixel defining part away from the substrate member, an organic light emitting layer on the pixel electrodes, a first common electrode on the organic light emitting layer, at least a portion of the first common electrode being on the pixel defining layer to overlap the light scattering spacer parts, a transmissive film on the first common electrode, and a second common electrode on the transmissive film.

16 Claims, 7 Drawing Sheets

ORGANIC LIGHT EMITTING DIODE DISPLAY AND METHOD OF MANUFACTURING THE SAME

BACKGROUND OF THE INVENTION

1. Field of the Invention

Example embodiments relate to an organic light emitting diode (OLED) display and a method of manufacturing the same. More particularly, example embodiments relate to an OLED display with improved display characteristics achieved by suppressing external light reflection, and a method of manufacturing the same.

2. Description of the Related Art

A conventional OLED display may include a plurality of OLEDs, each OLED having a hole injection electrode, an organic emission layer, and an electron injection electrode. An exciton may be formed by combining holes and electrons inside the organic light emitting layer, and light may be emitted by energy generated when the exciton falls from an excited state to a ground state, whereby the OLED display may form an image.

Accordingly, the OLED display is self-emissive, and may have reduced thickness and weight because a separate light source may not be required. The OLED display may also exhibit high-quality characteristics, e.g., low power consumption, high luminance, and rapid response time. The OLED display may be used in both stationary and portable devices.

The conventional OLED display, however, may include various electrodes and metal wires reflecting light entering from the outside. Reflection of the external light in the OLED display may reduce display characteristics, e.g., because of poor black representation and contrast.

The above information disclosed in this Background section is only for enhancement of understanding of the background of the invention and therefore it may contain information that does not form the prior art that is already known in this country to a person of ordinary skill in the art.

SUMMARY OF THE INVENTION

Example embodiments are therefore directed to an OLED display and a method of manufacturing the same, which substantially overcome one or more of the shortcomings and disadvantages of the related art.

It is therefore a feature of an example embodiment to provide an OLED display with a structure capable of suppressing external light reflection.

It is another feature of an example embodiment to provide a method of manufacturing an OLED display with a structure capable of suppressing external light reflection.

At least one of the above and other features may be realized by providing an OLED display, including a substrate member, a plurality of pixel electrodes on the substrate member, a pixel defining layer on the substrate member, the pixel defining layer including a pixel defining part and a plurality of light scattering spacer parts, the pixel defining part including a plurality of openings corresponding to and exposing the pixel electrodes, and the light scattering spacer parts protruding upward from the pixel defining part away from the substrate member, an organic light emitting layer on the pixel electrodes, a first common electrode on the organic light emitting layer, at least a portion of the first common electrode being on the pixel defining layer to overlap the light scattering spacer parts, a transmissive film on the first common electrode, and a second common electrode on the transmissive film.

The light scattering spacer parts of the pixel defining layer may protrude above the transmissive film at a thickness greater than that of the transmissive film, the thickness being measured along a direction normal to the substrate member. The transmissive film may be directly between the first and second common electrodes. The first and second common electrodes may completely overlap the transmissive film.

The first common electrode and the second common electrode may be in contact with each other on the light scattering spacer parts of the pixel defining layer.

One or more of the first common electrode and the second common electrode may be formed of a semi-transmissive film.

The semi-transmissive film may be made of at least one metal, the metal being one or more of magnesium (Mg), silver (Ag), calcium (Ca), lithium (Li), chromium (Cr), and aluminum (Al).

The OLED display may further include a sealing member disposed facing the substrate member with the pixel defining layer interposed therebetween, wherein the light scattering spacer parts of the pixel defining layer may maintain a gap between the substrate member and the sealing member.

The shape of the light scattering spacer parts of the pixel defining layer may include one or more of a prismoid, a prism, a cone, a cylinder, a hemisphere, and a semi-spheroid.

At least one of the above and other features may be realized by providing a method of manufacturing an OLED display, including forming a plurality of pixel electrodes on a substrate member, patterning a photosensitive material layer on the substrate member by a photolithography process using a mask to form a pixel defining layer on the substrate member, the pixel defining layer including a pixel defining part and a plurality of light scattering spacer parts, the pixel defining part including a plurality of openings corresponding to and exposing the pixel electrodes, and the light scattering spacer parts protruding upward from the pixel defining part away from the substrate member, forming an organic light emitting layer on the pixel electrodes, forming a first common electrode on the organic light emitting layer, at least a portion of the first common electrode being on the pixel defining layer to overlap the light scattering spacer parts, forming a transmissive film on the first common electrode, and forming a second common electrode on the transmissive film.

The photolithography process may include a half-tone exposure process.

The light scattering spacer parts of the pixel defining layer may protrude above the transmissive film at a height greater than that of the transmissive film.

The first common electrode and the second common electrode may be in contact with each other on the light scattering spacer parts of the pixel defining layer.

One or more of the first common electrode and the second common electrode may be formed of a semi-transmissive film.

The semi-transmissive film may be made of one or more metals among magnesium (Mg), silver (Ag), calcium (Ca), lithium (Li), chromium (Cr), and aluminum (Al).

The method of manufacturing an OLED display further includes disposing the sealing member to face the substrate member, with the pixel defining layer interposed therebetween, wherein the light scattering spacer parts of the pixel defining layer may maintain a gap between the substrate member and the sealing member.

The shape of the light scattering spacer parts of the pixel defining layer may include one or more of a prismoid, a prism, a cone, a cylinder, a hemisphere, and a semi-spheroid.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
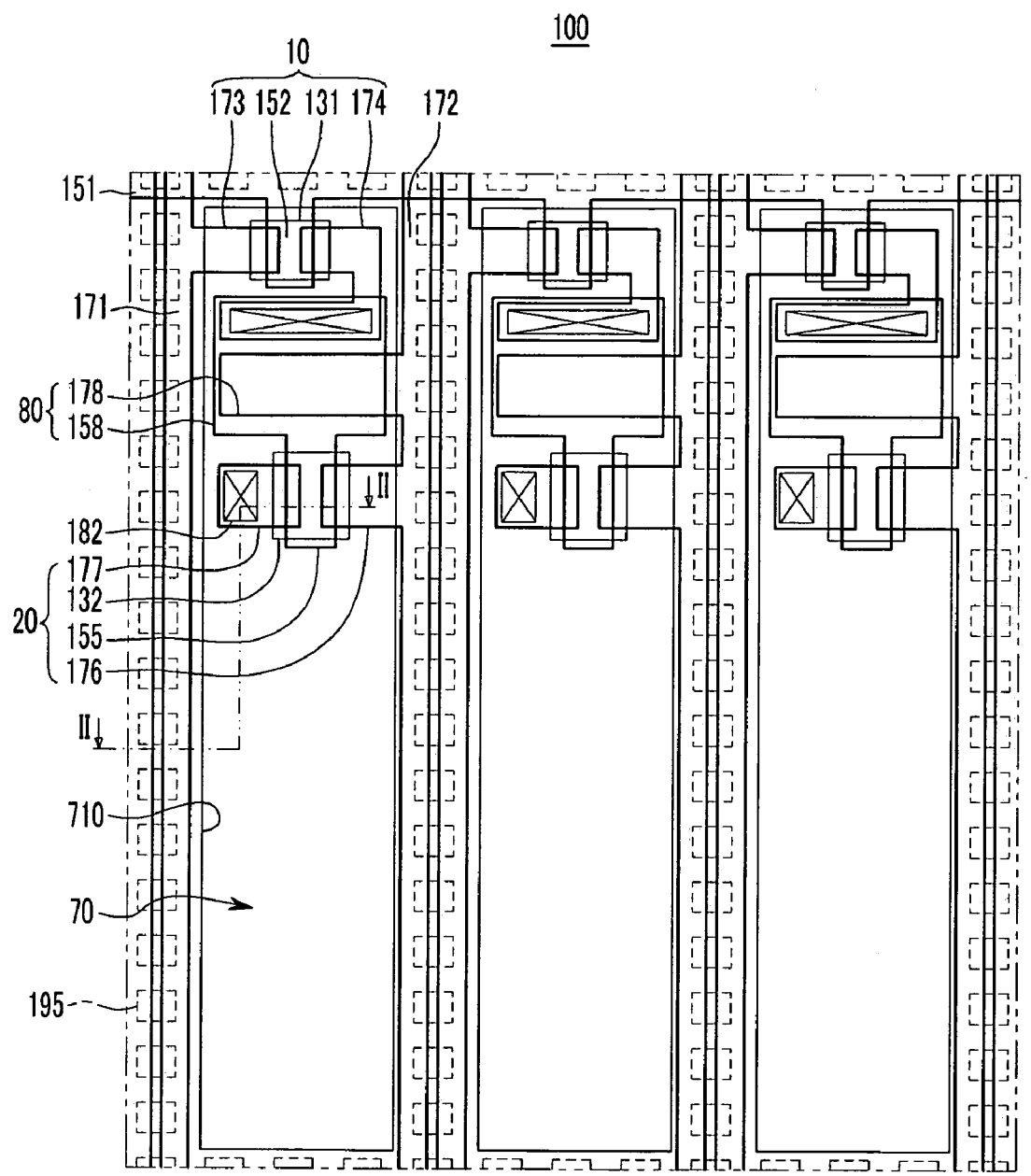
FIG. 1 illustrates a layout view of an OLED display according to an example embodiment.

Korean Patent Application No. 10-2009-0001163, filed on Jan. 7, 2009, in the Korean Intellectual Property Office, and entitled: "OLED Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers, elements, and regions may be exaggerated for clarity of illustration. It will also be understood that when a layer or element is referred to as being "on" another layer or substrate, it can be directly on the other layer or substrate, or intervening layers or elements may also be present. In addition, it will also be understood that when a layer is referred to as being "between" two layers or elements, it can be the only layer/element between the two layers and/or elements, or one or more intervening layers or elements may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together.

As used herein, the terms "a" and "an" are open terms that may be used in conjunction with singular items or with plural items.

It is noted that the accompanying drawings illustrate an active matrix (AM)-type OLED display having a 2Tr-1Cap structure in which one pixel may include two thin film transistors (TFTs) and one capacitor, but it is not limited thereto. Accordingly, an OLED display according to example embodiments may have, e.g., three or more TFTs and two or more capacitors in one pixel, and may have various structures including separate wires.

Herein, a pixel refers to a minimum unit used to display an image. The OLED display may display an image through a plurality of pixels. Hereinafter, an example embodiment will be described with reference to FIGS. 1-2.

Figure 2:
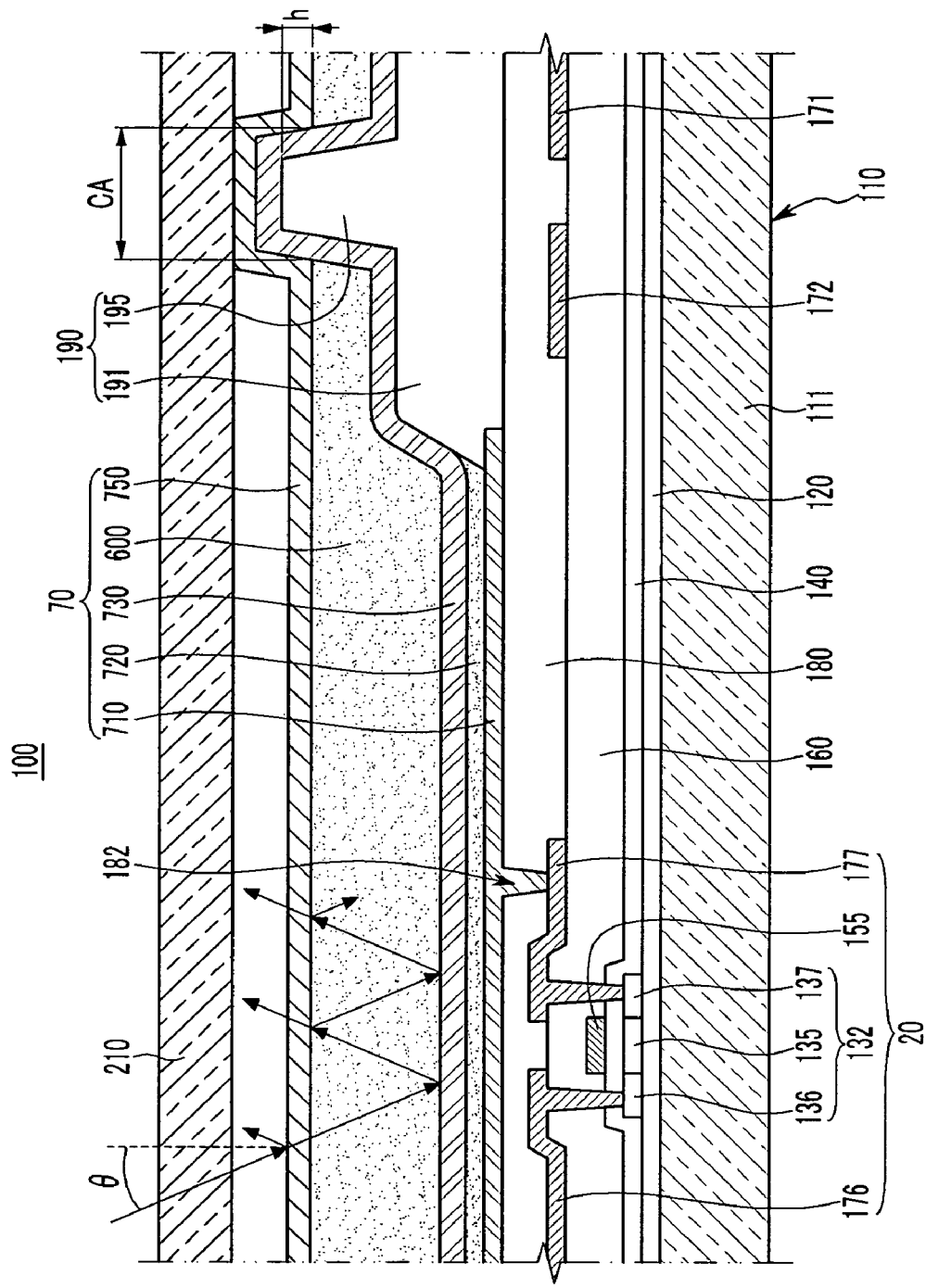
FIG. 2 illustrates a cross sectional view along line II-II of FIG. 1.

Referring to FIGS. 1 and 2, an OLED display 100 according to an example embodiment may include a switching TFT 10, a driving TFT 20, a capacitor 80, and an OLED 70 that may be arranged for one pixel. Additionally, the OLED display 100 may further include gate lines 151 arranged in one direction, data lines 171 insulated from and crossing the gate lines 151, and a common power line 172. One pixel may be defined by one gate line 151, one data line 171, and the common power line 172. However, the pixel may not be limited to the above definition.

As illustrated in FIG. 2, the OLED 70 may include a pixel electrode 710, an organic light emitting layer 720 formed on the pixel electrode 710, and a common electrode 730 formed on the organic light emitting layer 720. The pixel electrode 710 may be a positive (+) electrode, i.e., a hole injection electrode, and the common electrode 730 may be a negative (−) electrode, i.e., an electron injection electrode. It is noted, however, that example embodiments are not limited to the above description and other electrode configurations are within the scope of the present invention, e.g., the pixel electrode 710 may be a negative electrode and the common electrode 730 may be a positive electrode according to a driving method of the OLED display 100. Holes and electrons may be injected from the pixel electrode 710 and the common electrode 730, respectively, to the organic light emitting layer 720. Light may be emitted when excitons formed by combining the injected holes and electrons fall from an excited state to a ground state. Since one or more pixel electrodes 710 may be formed for each pixel, the OLED display 100 may have a plurality of pixel electrodes 710 spaced apart from each other.

As illustrated in FIGS. 1-2, the capacitor 80 may include a first capacitor plate 158 and a second capacitor plate 178 that may be arranged with a gate insulating film 140 interposed therebetween. The gate insulating film 140 may extend to the driving TFT 20 illustrated in FIG. 2.

As illustrated in FIG. 1, the switching TFT 10 may include a switching semiconductor layer 131, a switching gate electrode 152, a switching source electrode 173, and a switching drain electrode 174. The driving TFT 20, as illustrated in FIGS. 1-2, may include a driving semiconductor layer 132, a driving gate electrode 155, a driving source electrode 176, and a driving drain electrode 177.

The switching TFT 10 may be used as a switching element to select a pixel to emit light. The switching gate electrode 152 may be connected to the gate lines 151. The switching source electrode 173 may be connected to the data lines 171. The switching drain electrode 174 may be spaced apart from the switching source electrode 173 and may be connected to the first capacitor plate 158.

The driving TFT 20 may apply a driving power to the pixel electrode 710 to cause light emission from the organic light emitting layer 720 of the OLED 70 in the selected pixel, i.e., as selected by the switching TFT 10. The driving gate electrode 155 may be connected to the first capacitor plate 158. The driving source electrode 176 and the second capacitor plate 178 may be respectively connected to the common power line 172. The driving drain electrode 177 may be connected to the pixel electrode 710 of the OLED 70 through a contact hole 182.

With the above-described configuration, the switching TFT 10 may be driven by a gate voltage supplied to the gate lines 151, and may supply the gate voltage from the gate lines 151 to the driving TFT 20, i.e., data voltage. A voltage corresponding to a difference between the common voltage supplied from the common power line 172 to the driving TFT 20 and the data voltage supplied from the switching TFT 10 to the driving TFT 20 may be stored in the capacitor 80. A current corresponding to the voltage stored in the capacitor 80 may flow into the OLED 70 through the driving TFT 20 to cause the OLED 70 to emit light.

As further illustrated in FIG. 2, the OLED display 100 may include a pixel defining layer 190 and a sealing member 210.

The sealing member 210 and a substrate member 111 may be bonded and sealed together with the OLED 70 interposed therebetween. The sealing member 210 may cover and protect the switching and driving TFTs 10 and 20 and the OLED 70 formed on the substrate member 111, i.e., to seal the switching and driving TFTs 10 and 20 and the OLED 70 from the outside. Here, the components excluding the sealing member 210 may be referred to as a display substrate 110. The sealing member 210 may be an insulation substrate, e.g., glass or plastic substrate.

The pixel defining layer 190 may include a pixel defining part 191 having an opening for exposing the pixel electrode 710, and light scattering spacer parts 195 protruding in an upward direction, i.e., a direction extending from the pixel electrode 710 away from the substrate member 111, from the pixel defining part 191. The plurality of pixel electrodes 710 formed for each pixel may be formed at a position corresponding to the opening of the pixel defining part 191, e.g., each opening in the pixel defining part 191 may overlap a corresponding pixel electrode 710 to expose at least a portion thereof.

The pixel defining part 191 and the light scattering spacer parts 195 of the pixel defining layer 190 may be integrally formed of a photosensitive material by a photolithography process. That is, the pixel defining part 191 and the light scattering spacer parts 195 may be formed together by adjusting an exposure amount through a half-tone exposure process. However, example embodiments are not limited thereto, e.g., the pixel defining part 191 and the light scattering spacer parts 195 may be sequentially or independently formed, e.g., of different materials with respect to each other.

The light scattering spacer parts 195 of the pixel defining layer 190 may maintain a gap between the substrate member 111 and the sealing member 210. The light scattering spacer parts 195 may have any suitable shape. Examples of shapes may include a prismatoid, a prism, a cone, a cylinder, a spheroid, an ellipsoid, a hemisphere, and a semi-spheroid. The light scattering spacer parts 195 of the pixel defining layer 190 may scatter external light reflected from conductive films. For example, as illustrated in FIG. 2, the light scattering spacer parts 195 may be positioned on, e.g., to overlap, conductive films, e.g., gate lines 151, data lines 171, a common power line 172, etc., so external light reflection from the conductive films may be suppressed. Therefore, the OLED display 100 may suppress external light reflection more effectively by means of the light scattering spacer parts 195.

As illustrated in FIG. 2, the OLED 70 of the OLED display 100 may further include a transmissive film 600 formed on the common electrode 730 and an additional common electrode 750 formed on the transmissive film 600. Hereinafter, the common electrode 730 may be referred to as a first common electrode and the additional common electrode 750 may be referred to as a second common electrode.

The first common electrode 730 may be formed on the organic light emitting layer 720 and the pixel defining layer 190. For example, as illustrated in FIG. 2, the first common electrode 730 may extend on, e.g., directly on, the organic light emitting layer 720, and may extend conformally on, e.g., directly on, the pixel defining part 191 and light scattering spacer part 195.

The transmissive film 600 may be formed on the first common electrode 730. The transmissive film 600 may have a smaller thickness than that of the light scattering spacer parts 195 of the pixel defining layer 190. In other words, as illustrated in FIG. 2, an uppermost surface of the light scattering part 195, i.e., a surface facing away from the substrate member 111, may be higher by a distance h than an upper surface of the transmissive film 600, i.e., a surface facing away from the substrate member 111, as measured relative to the substrate member 111. That is, the light scattering spacer part 195 of the pixel defining layer 190 may protrude above the transmissive film 600 at a greater height than that of the transmissive film 600.

The second common electrode 750 may be formed on, e.g., directly on, the transmissive film 600. The second common electrode 750 may be connected to the first common electrode 730 in a contact area CA on the light scattering spacer parts 195 protruded above the transmissive film 600. For example, as illustrated in FIG. 2, the second common electrode 750 may be directly on and connected to the first common electrode 730 in the contact area CA, so the first common electrode 730 may be between the light scattering spacer part 195 and the second common electrode 750 in the contact area CA, e.g., only in the contact area CA. It is noted that the contact area CA may be defined as a region including an interface region between the first and second common electrodes 730 and 750, as illustrated in FIG. 2. It is further noted that the sealing member 210 may be positioned on the second common electrode 750. For example, since the light scattering spacer parts 195 protrude from the pixel defining part 191, the sealing member 210 may contact, e.g., directly contact, a portion of the second common electrode 750 on the light scattering spacer parts 195, e.g., only on the light scattering spacer parts 195, and may be spaced apart from portions of the second common electrode 750 overlapping portions other than the light scattering spacer parts 195, e.g., pixel electrode 171.

The first common electrode 730 and the second common electrode 750 may be formed of a semi-transmissive, i.e., semi-transparent, film. It is noted, however, that use of other materials to form the first and second common electrodes 730 and 750 is included within the scope of the present invention, e.g., one of the first common electrode 730 and the second common electrode 750 may be formed of a semi-transmissive film, and the other may be transparent. The transmissive film 600 may be tightly attached at both surfaces to the first common electrode 730 and the second common electrode 750, respectively. That is, the transmissive film 600 may be directly sandwiched between the first and second common electrodes 730 and 750 without contacting air, i.e., there may not be an interface between air and the transmissive film 600. For example, as illustrated in FIG. 2, the first and second common electrodes 730 and 750 may be configured to completely enclose, i.e., completely overlap and cover all surfaces, the transmissive film 600 therebetween. Accordingly, a considerable amount of light entering from the outside and incident on the transmissive film 600 through the second common electrode 750 may be eliminated by destructive interference caused by reflection between the first common electrode 730 and the second common electrode 750. It is noted that in order to cause destructive interference of light between the first common electrode 730 and the second common electrode 750, the transmissive film 600 may be configured to have an appropriate refractive index and thickness. Selection and adjustment of the refractive index and thickness of the transmissive film 600 will be explained in more detail below with reference to Formula 1.

In this manner, the OLED display 100 may improve display properties by suppressing external light reflection through the first common electrode 730, the transmissive film 600, and the second common electrode 750.

In addition, the second common electrode 750 may be connected to the first common electrode 730 in the contact area CA on the light scattering spacer parts 195 protruded above the transmissive film 600, thus suppressing a voltage drop (IR drop) between the first common electrode 730 and the second common electrode 750.

In addition, the light scattering spacer parts 195 of the pixel defining layer 190 may be formed over spaces between the plurality of pixel electrodes 710, e.g., between adjacent pixel electrodes 710. Due to this, it may be possible to prevent the first common electrode 730 and second common electrode 750, which may be connected to each other through the light scattering spacer parts 195, from affecting the quality of images displayed by the OLED display 100.

In addition, the first common electrode 730 and the second common electrode 750 may be connected to each other in regions between the pixel electrodes 710, i.e., the contact area CA may overlap a region between adjacent electrode pixels 710. Thus, such structure may effectively suppress light emitted from the OLED 70 from becoming poor and non-uniform due to voltage drop (IR drop).

As described above, the light scattering spacer parts 195 of the pixel defining layer 190 may facilitate connecting the first common electrode 730 and the second common electrode 750 to each other, may maintain the gap between the substrate member 111 and the sealing member 210, and may scatter external light to reduce reflection thereof. Therefore, the OLED display 100 with the scattering spacer parts 195 may effectively reduce external light reflection, thereby improving display properties thereof.

Hereinafter, the structure of the OLED display 100 according to an example embodiment will be described in more detail with reference to FIG. 2. FIG. 2 illustrates a portion of the OLED display 100 including the driving TFT 20 and the OLED 70.

Hereinafter, the structure of the driving TFT 20 will be described in detail. Additionally, the switching TFT 10 will be described briefly in comparison to the driving TFT 20.

The substrate member 111 may be formed of an insulating substrate made of, e.g., one or more of glass, quartz, ceramic, plastic, etc. However, the present invention is not limited thereto, so the first substrate member 111 may be formed of a metal substrate, e.g., stainless steel or the like.

A buffer layer 120 may be formed on the first substrate member 111. The buffer layer 120 may prevent or substantially minimize penetration of impurity elements, and may planarizing a surface. The buffer layer 120 may be formed of, e.g., one or more of a silicon nitride (SiNx) film, a silicon oxide (SiOx) film, and a silicon oxynitride (SiOxNy). However, the buffer layer 120 may not be necessarily required, and may be omitted according to the type of the first substrate member 111 and the process conditions.

A driving semiconductor layer 132 may be formed on the buffer layer 120. The driving semiconductor layer 132 may be formed of, e.g., a polysilicon film. Further, the driving semiconductor layer 132 may include a channel region 135 in which no impurity may be doped, and a source region 136 and a drain region 137. The source and drain regions 136 and 137 may be doped with a dopant, e.g., p+ ions, and may be formed at both sides of the channel region 135, respectively. The p+ ions may be, e.g., boron (B), $B_2H_6$, etc. The dopant may differ according to the type of the TFTs. For example, a TFT of a PMOS structure using a P-type impurity as the driving TFT 20 may be used, but it may be not limited thereto, e.g., TFTs of both NMOS and CMOS structures may be used as the driving TFT 20.

In this respect it is noted that while the driving TFT 20 illustrated in FIG. 2 may be a polycrystalline TFT including a polysilicon film, the switching TFT 10 (not shown in FIG. 2) may be a polycrystalline TFT or an amorphous TFT including an amorphous silicon film.

The gate insulating film 140 may be formed, e.g., of silicon nitride (SiNx) or silicon oxide ($SiO_2$), on the driving semiconductor layer 132. Gate wires including the driving gate electrode 155 may be formed on the gate insulating film 140. The gate wires may further include gate lines 151 (shown in FIG. 1), a first capacitor plate 158 (shown in FIG. 1), and other wires. In addition, the driving gate electrode 155 may be formed to overlap at least a portion of the driving semiconductor layer 132, e.g., overlap at least a portion of the channel region 135.

An interlayer insulating film 160 covering the driving gate electrode 155 may be formed on the gate insulating film 140. The gate insulating layer 140 and the interlayer insulating layer 160 may have through holes therethrough to expose the source area 136 and drain area 137 of the driving semiconductor layer 132. Like the gate insulating film 140, the interlayer insulating layer 160 may be formed of, e.g., silicon nitride (SiNx) or silicon oxide ($SiO_2$).

Data wires including a driving source electrode 176 and a driving drain electrode 177 may be formed on the interlayer insulating film 160. The data wires may further include data lines 171, a common power line 172, a second capacitor plate 178 (shown in FIG. 1), and other wires. In addition, the driving source electrode 176 and the driving drain electrode 177 may be respectively connected to the source area 136 and drain area 137 of the driving semiconductor layer 132 through the through holes.

In this manner, the driving TFT 20 including the driving semiconductor layer 132, the driving gate electrode 155, the driving source electrode 176, and the driving drain electrode 177 may be formed. The configuration of the driving TFT 20 may not be limited to the foregoing example, but may be changed into a variety of well-known configurations that may be easily carried out by those skilled in the art.

A planarization film 180 covering the data wires 171, 172, 176, 177, and 178 may be formed on the interlayer insulating film 160. The planarization film 180 may eliminate and planarize a stepped region in order to increase the light emission efficiency of the OLED 70 to be formed thereon. Further, the planarization film 180 may have a contact hole 182 for exposing a part of the drain electrode 177. The planarization film 180 may be made of one or more of, e.g., polyacrylate resin, epoxy resin, phenolic resin, polyamides resin, polyimide resin, unsaturated polyesters resin, poly (phenylenether) resin, poly (phenylenesulfide) resin, and benzocyclobutene (BCB).

The pixel electrode 710 of the OLED 70 may be formed over the planarization film 180. The pixel electrode 710 may be connected to the drain electrode 177 through the contact hole 182 of the planarization film 180.

The pixel defining layer 190 may be formed over the planarization film 180. The pixel defining layer 190 may include a pixel defining part 191 having an opening for exposing the pixel electrode 710, and a plurality of light scattering spacer parts 195 protruded upward, i.e., a direction directed away from the planarization film 180, from the pixel defining part 191. That is, the pixel electrode 710 may be disposed so as to correspond, e.g., overlap, to the opening of the pixel defining layer 190.

The pixel defining layer 190 may be made of, e.g., a polyacrylate resin or a polyimide resin. For example, the pixel defining part 191 and the light scattering spacer parts 195 of the pixel defining layer 190 may be integrally formed, but it may not be limited thereto, e.g., the pixel defining part 191 and the light scattering spacer parts 195 may be formed separately.

The light scattering spacer parts 195 of the pixel defining layer 190 may scatter external light reflected from conductive films, e.g., the gate lines 151, data lines 171, and common power line 172, disposed under the light scattering spacer parts 195, i.e., between the substrate member 111 and the light scattering spacer parts 195.

The organic light emitting layer 720 may be formed on the pixel electrode 710 in the opening of the pixel defining part 191, and the first common electrode 730 may be formed on the pixel defining layer 190 and the organic light emitting layer 720. In this manner, the OLED 70 including the pixel electrode 710, the organic light emitting layer 720, and the common electrode 730 may be formed.

In an example embodiment, the OLED 70 may further include the transmissive film 600 and the second common electrode 750. The transmissive film 600 may be formed over the first common electrode 730. The transmissive film 600 may be an organic film or an inorganic film. In addition, the transmissive film 600 may be adjusted to have a predetermined thickness, i.e., within an appropriate range. The predetermined thickness of the transmissive film 600 may be determined according to the refractive index of the transmissive film 600.

In addition, the transmissive film 600 may have a smaller height, i.e., thickness as measured along a direction normal to the substrate member 111, than that of the light scattering spacer parts 195. That is, the light scattering spacer parts 195 of the pixel defining layer 190, i.e., the uppermost surface of the light scattering spacer part 195, may protrude above the transmissive film 600, i.e., the upper surface of the transmissive film 600.

The second common electrode 750 may be formed over the transmissive film 600. The second common electrode 750 may be connected to the first common electrode 730 in the contact area CA on the light scattering spacer parts 195 protruding above the transmissive film 600.

The first common electrode 730 and the second common electrode 750 may be formed of a semi-transmissive film. For example, the semi-transmissive film 600 may include metal, e.g., one or more of magnesium (Mg), silver (Ag), calcium (Ca), lithium (Li), chromium (Cr), and aluminum (Al).

The first common electrode 730 and the second common electrode 750 may exhibit sufficient reflectance to effectively emit light generated by the OLED 70, while minimizing reflection of external light. For example, the first common electrode 730 may exhibit reflectance of about 50% or less, and the second common electrode 750 may exhibit reflectance of about 30% or less.

The transmissive film 600 may be tightly attached at both surfaces to the first common electrode 730 and the second common electrode 750, respectively. That is, there may be no interface with air between the transmissive film 600 and the first common electrode 730 and second common electrode 750.

The thickness and refractive index of the transmissive film 600 may be adjusted to optimize destructive interference of light between the first common electrode 730 and the second common electrode 750. The thickness and refractive index of the transmissive film 600 may be established by Formula 1 below derived for a condition of destructive interference of reflected light.

$$d = \lambda/(4n)\cos\theta \qquad \text{Formula 1}$$

It is noted that in Formula 1 above, d refers to a distance between two reflecting surfaces. That is, d may equal a distance between the first common electrode 730 and the second common electrode 750, i.e., the thickness of the transmissive film 600. Further, n in Formula 1 above refers to a refractive index of a medium, i.e., the transmissive film 600, θ refer to an incident angle of light on the medium, i.e., incident angle of external light on the transmissive film 600, and λ refers to a wavelength of reflected light.

The wavelength of the reflected light, i.e., a wavelength of visible light, and a refractive index of a material used for the transmissive film 600 may be substituted into Formula 1. An average incident angle of external light may be approximated as about 30 degrees to about 45 degrees, i.e., with respect to a normal to the transmissive film 600 as illustrated in FIG. 2, and substituted into Formula 1. Based on the above, an average thickness of the transmissive film 600 may be calculated. That is, the transmissive film 600 may be made of a predetermined material, i.e., having a predetermined refractive index, so the thickness may be adjusted according to the type of material used for the transmissive film 600 in order to provide destructive interference of light between the first and second common electrodes 730 and 750. Alternatively, the transmissive film 600 may have a predetermined thickness, so the material for forming the transmissive film 600 may be adjusted, i.e., a material having an appropriate refractive index, in order to form the transmissive film 600 at a desired thickness for providing destructive interference of light between the first and second common electrodes 730 and 750 according to Formula 1 above. As described above, when a thickness of the transmissive film 600 is adjusted, the thickness may be set to be smaller than that of the light scattering spacer parts 195 of the pixel defining layer 190.

With the above-described structure, when external light is incident on the OLED display 100, as illustrated in FIG. 2, the external light may be transmitted to be incident on the second common electrode 750. Based on the reflectance of the second common electrode 750, a first portion of the external light may be reflected away from the second common electrode 750 and a second portion of the external light may be transmitted through the transmissive film 600 toward the first common electrode 730, as illustrated in FIG. 2. The second portion of the external light incident on the first common electrode 730 may be reflected back toward the second common electrode 750, as further illustrated in FIG. 2. A part of the light directed toward the second common electrode 750 from the first common electrode 730 may be emitted to the outside through the second common electrode 750, and another part thereof may be reflected again and directed toward the first common electrode 730. In this manner, as the external light entering from the outside may be repeatedly reflected between the first common electrode 730 and the second common electrode 750, with the transmissive film 600 interposed therebetween, destructive interference may occur between the first and second common electrodes 730 and 750. Therefore, a substantial amount of the external light incident on the second common electrode 750 may be eliminated. Thus, the OLED display 100 according to example embodiments may exhibit substantially reduced reflection of external light, thereby exhibiting improved display properties.

In addition, the first common electrode 730 and the second common electrode 750 may be connected to each other in the contact area CA on the light scattering spacer parts 195 protruding above the transmissive film 600, thus suppressing a voltage drop (IR drop) to be generated between the first common electrode 730 and the second common electrode 750.

In addition, the light scattering spacer parts 195 of the pixel defining layer 190 may be formed over spaces between the plurality of pixel electrodes 710. Due to this, it may be possible to prevent or substantially minimize the first common electrode 730 and second common electrode 750 connected to each other through the light scattering spacer parts 195 from affecting the quality of images displayed by the OLED display 100.

In addition, since the first common electrode 730 and the second common electrode 750 may be connected to each other between the pixel electrodes 710, this may more effectively suppress the light emitted from the OLED 70 from becoming poor and non-uniform due to the voltage drop (IR drop).

Further, as described above, the first common electrode 730 and the second common electrode 750 may be formed as a semi-transmissive type. However, the OLED display 100 according the example embodiments may not be limited thereto, e.g., either one of the first common electrode 730 and the second common electrode 750 may be formed as a transmissive type. Meanwhile, the pixel electrode 710 may be formed of any one of a transparent type, a semi-transmissive type, and a reflective type. A transparent conductive material may include one or more of, e.g., indium tin oxide (ITO), indium zinc oxide (IZO), zinc oxide (ZnO), and indium oxide ($In_2O_3$). A reflective or semi-transmissive material may include one or more of, e.g., lithium (Li), calcium (Ca), lithium fluoride/calcium (LiF/Ca), lithium fluoride/aluminum (LiF/Al), aluminum (Al), silver (Ag), magnesium (Mg), and gold (Au).

The OLED display 100 may be a front emission type, a rear emission type, or a both-direction emission type according to the type of material forming the pixel electrode 710, the first common electrode 730, and the second common electrode 750. For example, the OLED display 100 may be a front emission type when the OLED 70 displays an image by emitting light in the direction of the sealing member 210.

The organic light emitting layer 720 may be made of a low molecular organic material or a polymer material. The organic light emitting layer 720 may be formed as multiple layers including a light emitting layer and one or more of a hole-injection layer (HIL), a hole-transporting layer (HTL), an electron-transporting layer (ETL), and an electron-injection layer (EIL). That is, the hole-injection layer may be disposed on the pixel electrode 710, and the hole-transporting layer, the light emitting layer, the electron-transporting layer, and the electron-injection layer may, be sequentially stacked on the hole-injection layer.

The sealing member 210 may be disposed on the OLED 70. The sealing member 210 may be disposed to face the substrate member 111, and may cover the driving TFT 20 and the OLED 70. In addition, the gap between the substrate member 111, i.e., the display substrate 110, and the sealing member 210, may be maintained by the light scattering spacer parts 195 of the pixel defining layer 190.

With the above-described configuration, the OLED display 100 may exhibit improved display properties by suppressing external light reflection.

Hereinafter, referring to FIGS. 3 to 7, a method of manufacturing an OLED display according to example embodiments, e.g., the OLED display 100, will be described.

Figure 3:
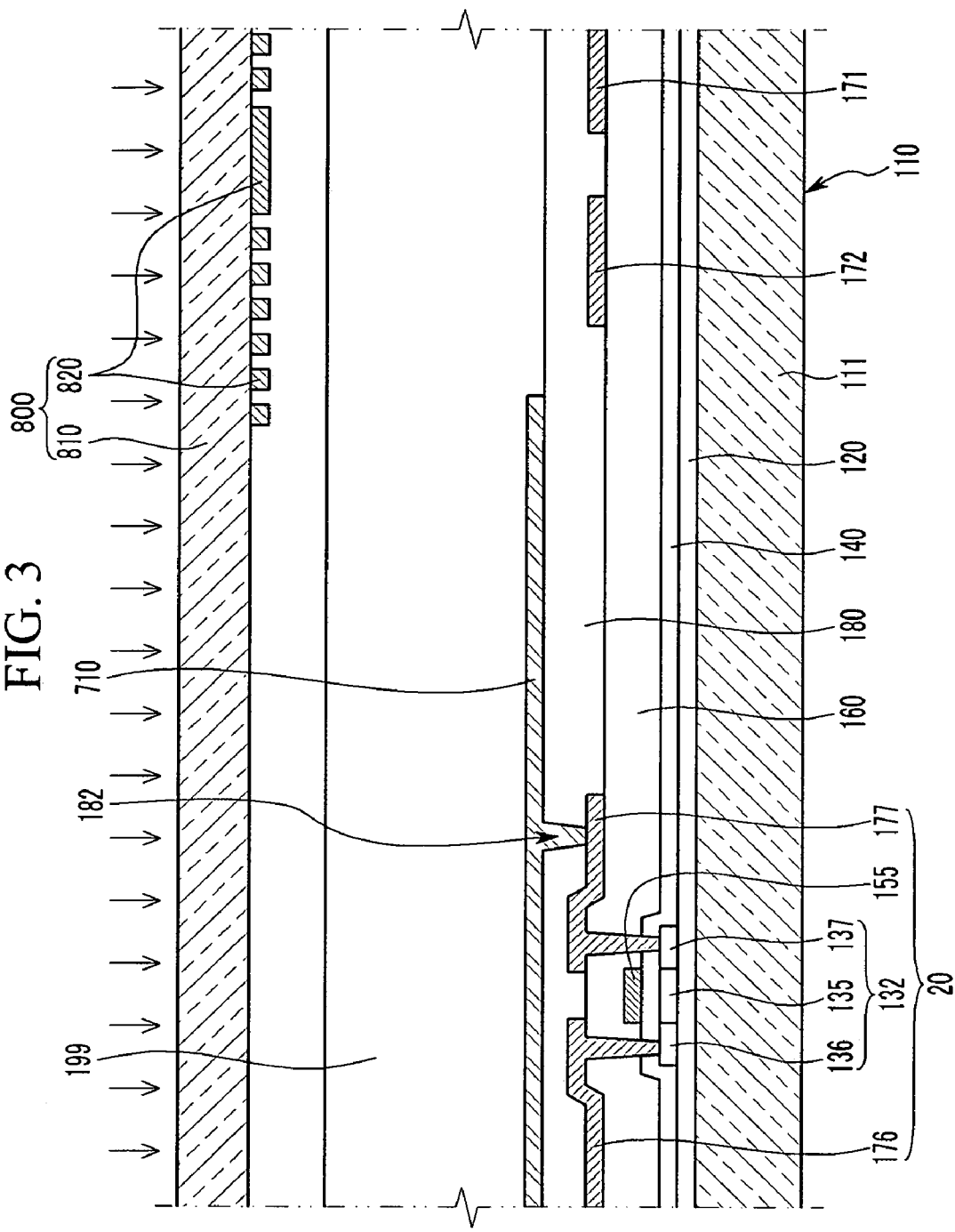
FIGS. 3-7 illustrate cross-sectional views of sequential stages in a manufacturing process of an OLED display according to an example embodiment.

As illustrated in FIG. 3, the driving TFT 20 and the pixel electrode 710 connected to the drain electrode 177 of the driving TFT 20 may be formed on the substrate member 111. Next, a photosensitive material layer 199 may be applied on the pixel electrode 710, and a photolithography process may be carried out by using a mask 800. The mask 800 may include a mask substrate 810 and a light shielding pattern 820 formed on the mask substrate 810. The photolithography process may include a half-tone exposure process using a mask 800 having a slit pattern.

An exposed portion of the photosensitive material layer 199 may be removed, and an unexposed portion thereof may remain through a developing process. Alternatively, according to the type of the photosensitive material layer 199, the exposed portion may remain and the unexposed portion may be removed.

Figure 4:
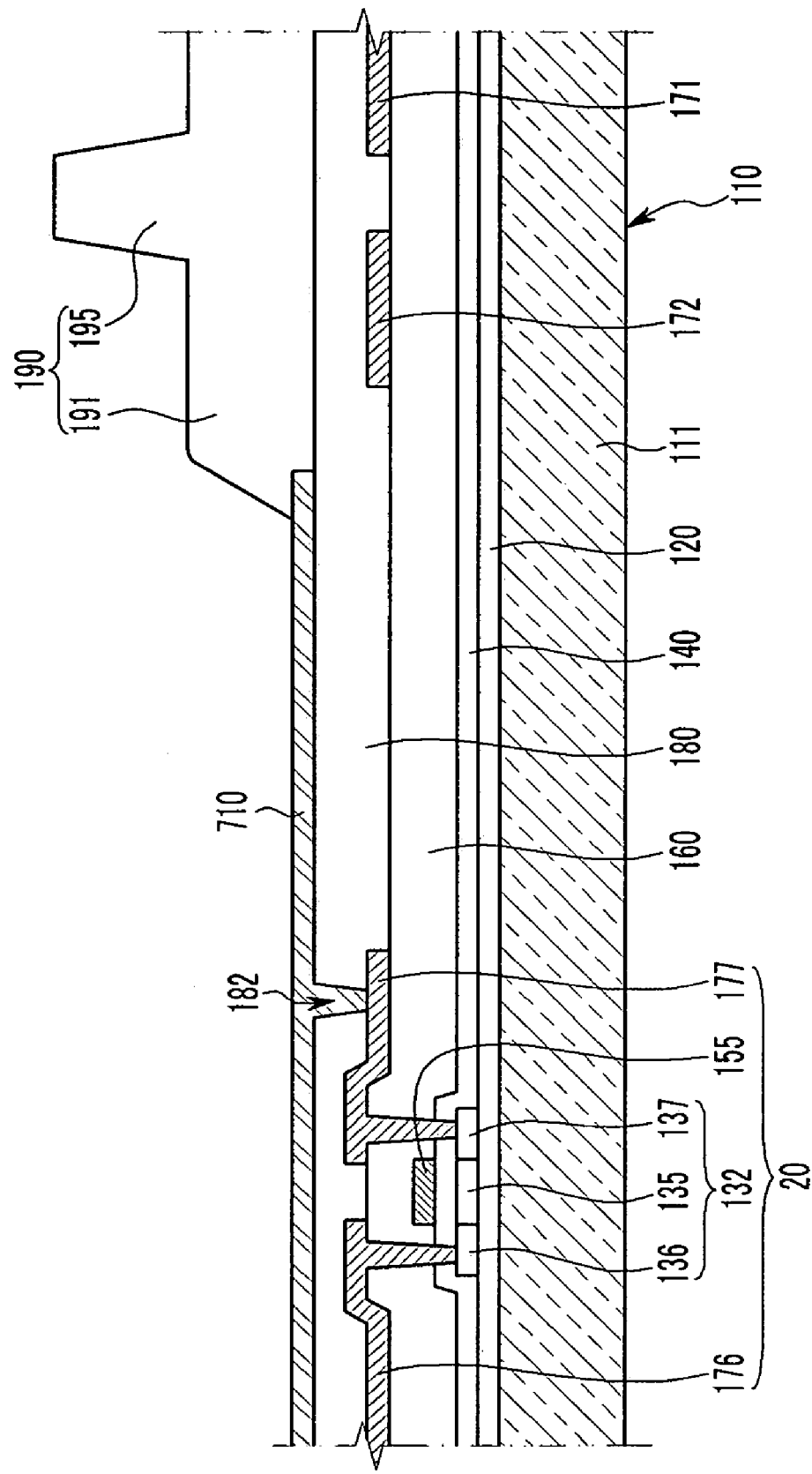

Next, as illustrated in FIG. 4, the pixel defining layer 190 having the pixel defining part 191 and light scattering spacer parts 195 may be formed through the mask 800 in the developing process.

Figure 5:
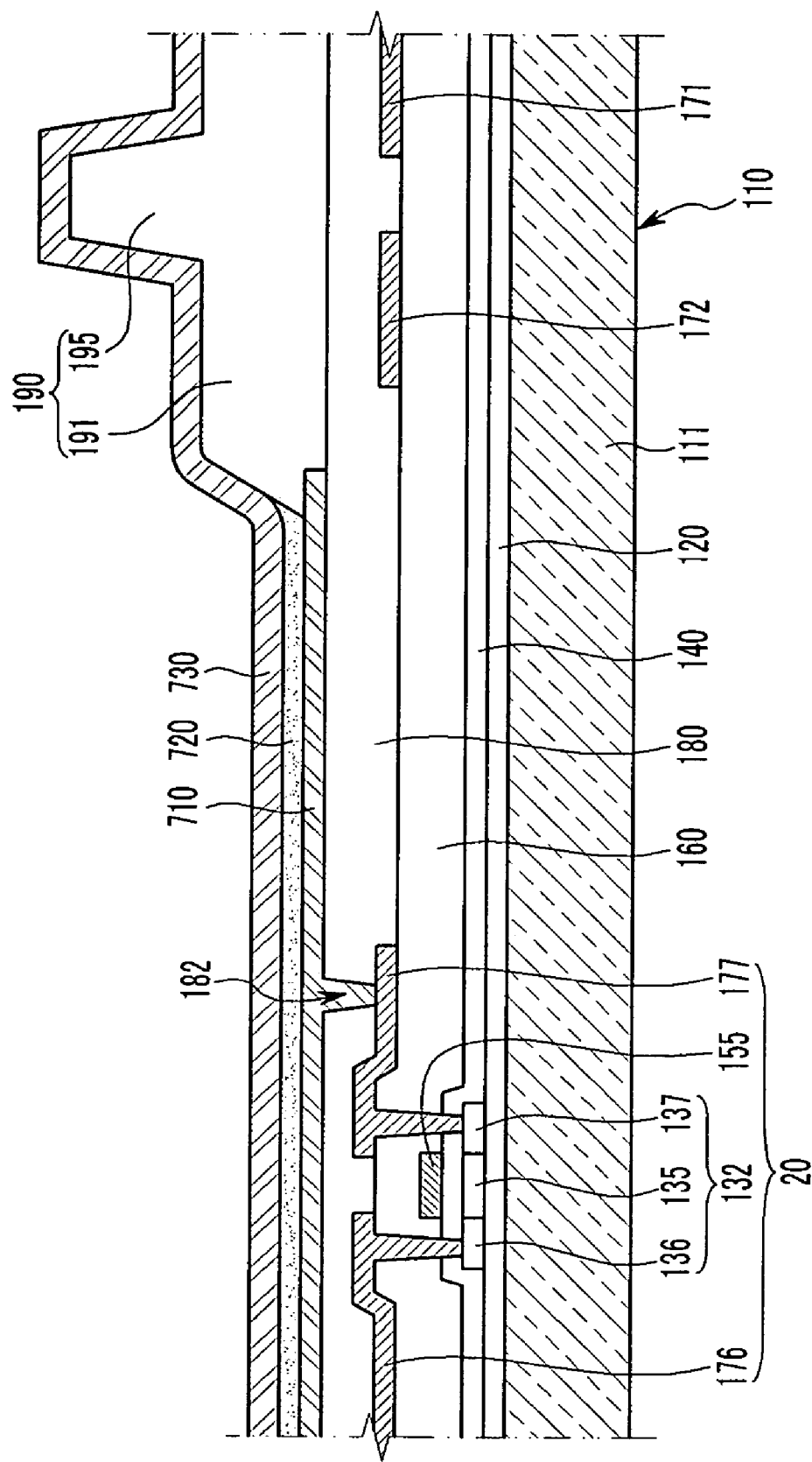

Next, as illustrated in FIG. 5, the organic light emitting layer 720 and the first common electrode 730 may be formed on the pixel electrode 710 exposed through the opening of the pixel defining part 191. The first common electrode 730 may cover at least a portion of the pixel defining layer 190.

Figure 6:
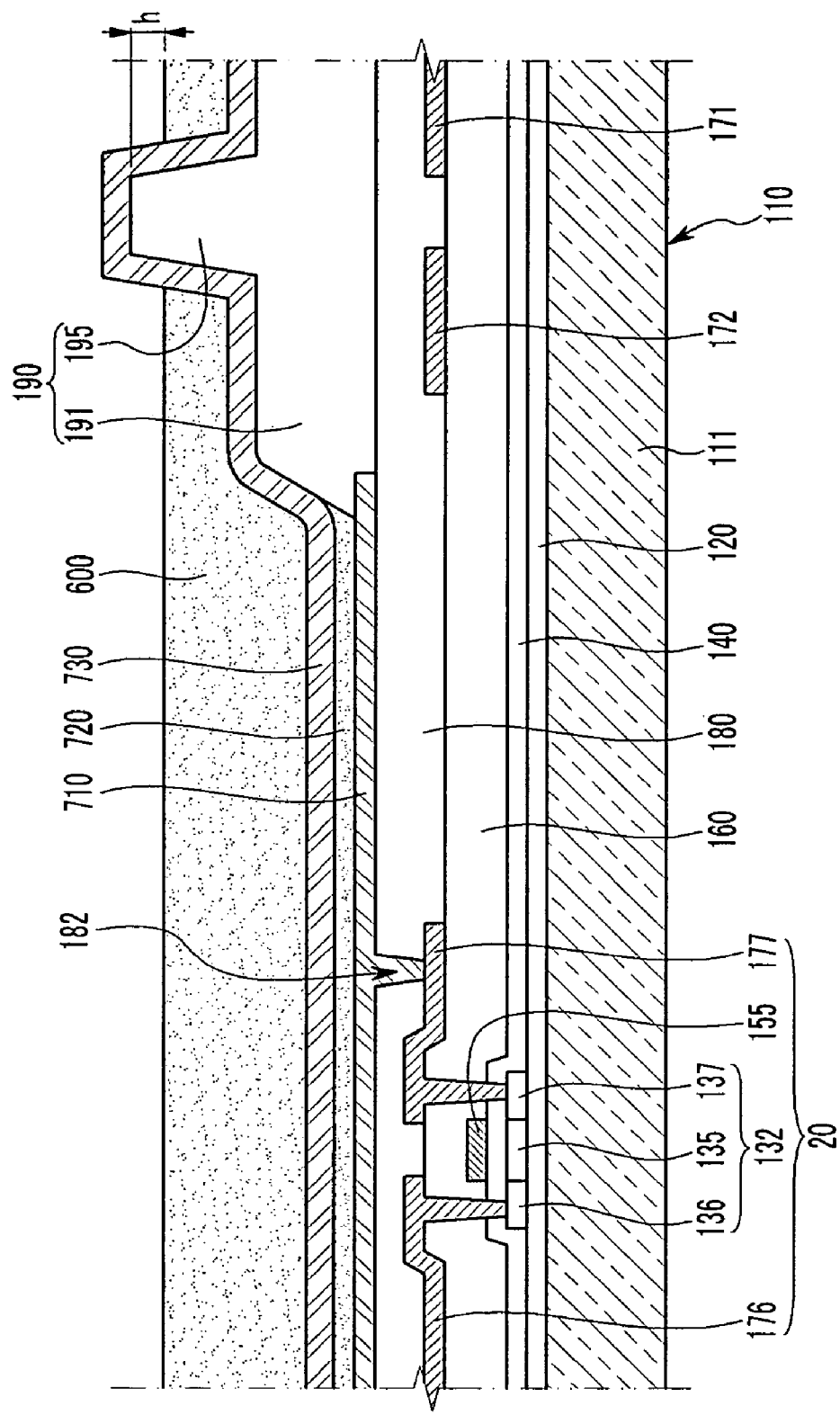

Next, as shown in FIG. 6, the transmissive film 600 may be formed on the first common electrode 730 to the predetermined thickness. The transmissive film 600 may have a smaller thickness than that of the light scattering spacer parts 195 of the pixel defining layer 190. That is, the light scattering spacer parts 195 of the pixel defining layer 190 may have a greater height (h) than that of the transmissive film 600 and may protrude above the transmissive film 600. In addition, the transmissive film 600 may be formed of a material having an appropriate reflective index, i.e., to provide the predetermined thickness as discussed previously with reference to Formula 1.

Figure 7:
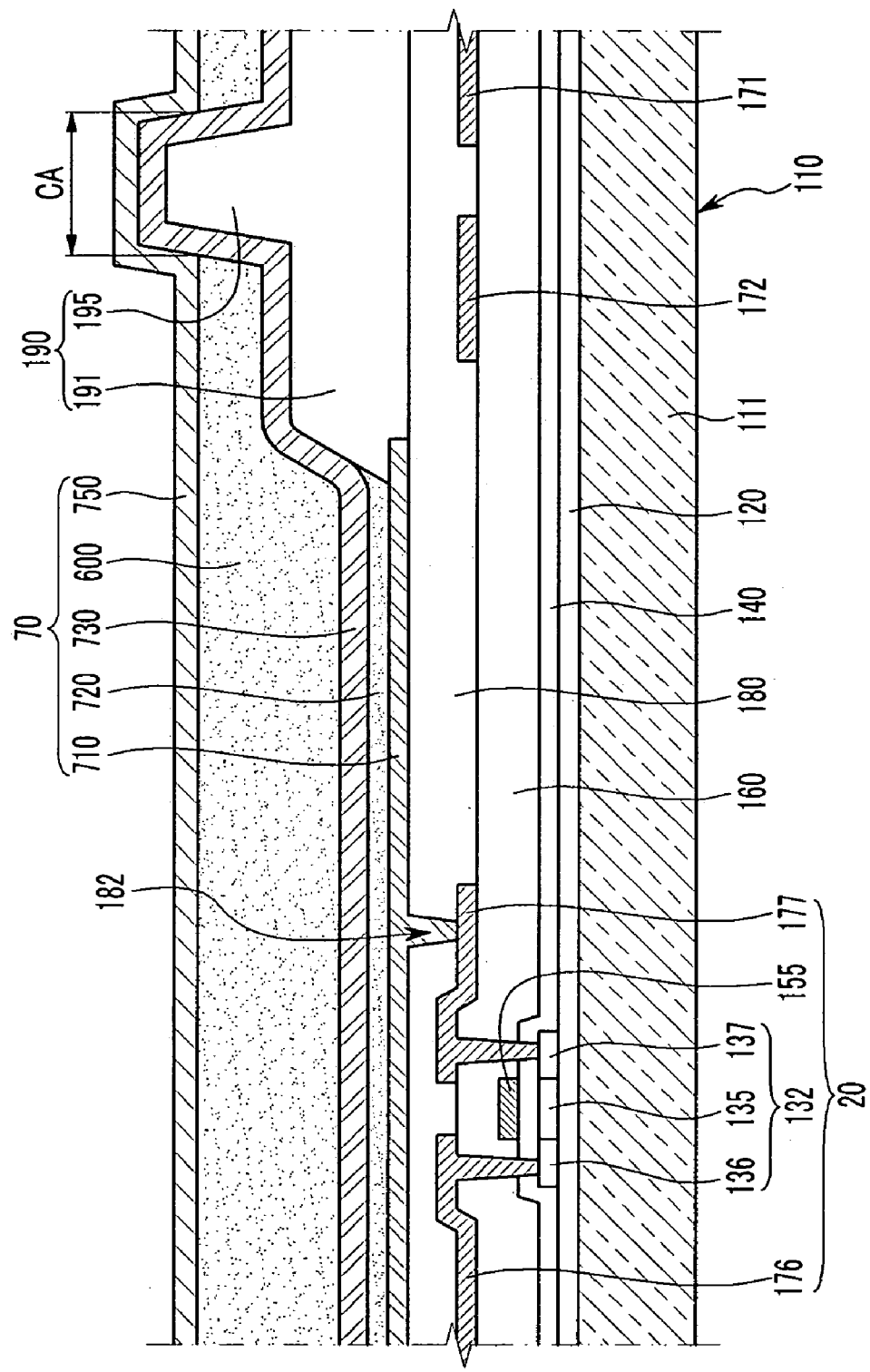

Next, as illustrated in FIG. 7, the second common electrode 750 may be formed on the transmissive film 600. The second common electrode 750 may be connected to the first common electrode 730 in the contact area CA on the light scattering spacer parts 195 protruding above the transmissive film 600.

At least one of the first common electrode 730 and the second common electrode 750 may be a semi-transmissive film formed of one or more metals, i.e., one or more of magnesium (Mg), silver (Ag), calcium (Ca), lithium (Li), chromium (Cr), and aluminum (Al).

Next, the sealing member 210 may be disposed on the second common electrode 750 to complete the OLED display 100 as illustrated in FIG. 2. The light scattering spacer parts 195 of the pixel defining layer 190 may maintain the gap between the substrate member 111 and the sealing member 210.

According to this manufacturing method, it may be possible to manufacture an OLED display having improved display properties by suppressing external light reflection.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a substrate member;
    a plurality of pixel electrodes on the substrate member;
    a pixel defining layer on the substrate member, the pixel defining layer including a pixel defining part and a plurality of light scattering spacer parts, the pixel defining part including a plurality of openings corresponding to and exposing the pixel electrodes, and the light scattering spacer parts protruding upward from the pixel defining part away from the substrate member;

an organic light emitting layer on the pixel electrodes;

a first common electrode on the organic light emitting layer, at least a portion of the first common electrode being on the pixel defining layer to overlap the light scattering spacer parts;

a transmissive film on the first common electrode; and a second common electrode on the transmissive film, wherein the light scattering spacer parts of the pixel defining layer protrude above the transmissive film, a thickness of the light scattering spacer parts being greater than a thickness of the transmissive film, the thicknesses being measured along a direction normal to the substrate member, and the first common electrode and the second common electrode are in contact with each other on the light scattering spacer parts of the pixel defining layer.

2. The OLED display as claimed in claim 1, wherein one or more of the first common electrode and the second common electrode includes a semi-transmissive film.

3. The OLED display as claimed in claim 2, wherein the semi-transmissive film includes at least one metal, the metal being one or more of magnesium (Mg), silver (Ag), calcium (Ca), lithium (Li), chromium (Cr), and aluminum (Al).

4. The OLED display as claimed in claim 1, further comprising a sealing member on the substrate member, the pixel defining layer being between the sealing member and the substrate member, and the light scattering spacer parts of the pixel defining layer maintaining a gap between the substrate member and the sealing member.

5. The OLED display as claimed in claim 4, wherein the light scattering spacer parts of the pixel defining layer have a shape of a prismoid, a prism, a cone, a cylinder, a hemisphere, or a semi-spheroid.

6. The OLED display as claimed in claim 1, wherein the transmissive film is directly between the first and second common electrodes.

7. The OLED display as claimed in claim 6, wherein the first and second common electrodes completely overlap the transmissive film.

8. A method of manufacturing an organic light emitting diode (OLED) display, comprising:

forming a plurality of pixel electrodes on a substrate member;

forming a pixel defining layer on the substrate member, the pixel defining layer including a pixel defining part and a plurality of light scattering spacer parts, the pixel defining part including a plurality of openings corresponding to and exposing the pixel electrodes, and the light scattering spacer parts protruding upward from the pixel defining part away from the substrate member;

forming an organic light emitting layer on the pixel electrodes;

forming a first common electrode on the organic light emitting layer, at least a portion of the first common electrode being on the pixel defining layer to overlap the light scattering spacer parts;

forming a transmissive film on the first common electrode; and forming a second common electrode on the transmissive film, wherein the light scattering spacer parts of the pixel defining layer are formed to protrude above the transmissive film at a greater height than that of the transmissive film, and the first common electrode and the second common electrode are formed to contact each other on the light scattering spacer parts of the pixel defining layer.

9. The method as claimed in claim 8, wherein forming a pixel defining layer includes patterning a photosensitive material layer on the substrate member by a photolithography process using a mask.

10. The method as claimed in claim 9, wherein the photolithography process includes a half-tone exposure process.

11. The method as claimed in claim 8, wherein one or more of the first common electrode and the second common electrode are formed of a semi-transmissive film.

12. The method as claimed in claim 11, wherein the semi-transmissive film is made of at least one metal, the metal being one or more of magnesium (Mg), silver (Ag), calcium (Ca), lithium (Li), chromium (Cr), and aluminum (Al).

13. The method as claimed in claim 8, further comprising disposing a sealing member to face the substrate member, with the pixel defining layer interposed therebetween, such that the light scattering spacer parts of the pixel defining layer maintain a gap between the substrate member and the sealing member.

14. The method as claimed in claim 13, wherein the light scattering spacer parts of the pixel defining layer are formed in a shape of a prismoid, a prism, a cone, a cylinder, a hemisphere, or a semi-spheroid.

15. The method as claimed in claim 13, wherein the transmissive film is formed directly between the first and second common electrodes.

16. The method as claimed in claim 15, wherein the first and second common electrodes are formed to completely overlap the transmissive film.

* * * * *